(12) United States Patent
Anderson

(10) Patent No.: US 7,532,017 B2
(45) Date of Patent: May 12, 2009

(54) DETECTION OF PRESENCE OR ABSENCE OF AC MAINTAIN POWER SIGNATURE IN POWER-OVER-ETHERNET SYSTEM

(75) Inventor: Douglas Paul Anderson, Nevada, IA (US)

(73) Assignee: Micrel, Inc., San Jose, CA (US)

( * ) Notice: Subject to any disclaimer, the term of this patent is extended or adjusted under 35 U.S.C. 154(b) by 31 days.

(21) Appl. No.: 11/865,977

(22) Filed: Oct. 2, 2007

(65) Prior Publication Data

US 2009/0085586 A1    Apr. 2, 2009

(51) Int. Cl.
G01R 27/08 (2006.01)
G06F 1/00 (2006.01)
H01J 19/82 (2006.01)

(52) U.S. Cl. .................. 324/705; 324/691; 713/330; 327/531

(58) Field of Classification Search ............. None
See application file for complete search history.

(56) References Cited

U.S. PATENT DOCUMENTS 5,406,260 A    4/1995 Cummings et al.
6,597,183 B1*  7/2003 Male ................ 324/607
6,986,071 B2*  1/2006 Darshan et al. ......... 713/330
2007/0164754 A1* 7/2007 Smith et al. ............ 324/613
2007/0164768 A1* 7/2007 Hsu et al. .............. 324/765
2008/0080105 A1* 4/2008 Blaha et al. ............. 361/38

* cited by examiner

*Primary Examiner*—Timothy J Dole
*Assistant Examiner*—Jeff Natalini
(74) *Attorney, Agent, or Firm*—Patent Law Group LLP; Carmen C. Cook

(57) ABSTRACT

An AC maintain power signature detection circuit in a power sourcing equipment (PSE) for a Power over Ethernet system injects an AC test signal onto a power port of the PSE. The AC test signal is driven onto a first power terminal of the power port through a sense resistor. The voltages across the sense resistor are measured and scaled by first and second resistor dividers having different resistor ratios. The voltage and the scaled voltage at the first power terminal side of the sense resistor have a peak voltage being proportional to the load impedance of the load coupled to the power port. The comparator compares the scaled voltages measured across the sense resistor and generates the output signal indicative of the load impedance at the power port.

28 Claims, 4 Drawing Sheets

DETECTION OF PRESENCE OR ABSENCE OF AC MAINTAIN POWER SIGNATURE IN POWER-OVER-ETHERNET SYSTEM

FIELD OF THE INVENTION

The invention relates to Power over Ethernet (PoE) systems and, in particular, to a method and circuit for detecting the presence or absence of AC maintain power signature in PoE systems.

DESCRIPTION OF THE RELATED ART

Power Over Ethernet (PoE) technology has been developed to allow user devices, such as IP telephones, wireless LAN Access Points and other appliances, to receive power as well as data over existing network cabling, without needing to modify the existing Ethernet infrastructure. Electrical systems that distribute power over Ethernet cabling are described and defined by IEEE Standard 802.3-2005, Clause 33.

In general, a PoE network is formed by a Power Sourcing Equipment (PSE) supplying power and a Powered Device (PD) receiving and utilizing the power. A PSE, which can be an endspan or a midspan network device, injects power through a power port onto the designated twisted wire pair of the Ethernet cables forming the local area network. At the other end of the cables, the power is used to run the Powered Devices so that no additional source of power needs to be provided to the Powered Devices. The Power Sourcing Equipment thereby provides on the same Ethernet cable both power and data signals to the Powered Devices.

Under the requirements of IEEE Standard 802.3-2005, section 33.2.10, power sourcing equipment must monitor a power port that is powered up for the presence of either a DC, or AC, or both AC and DC Maintain Power Signatures (MPS). When the MPS is absent, the PSE must discontinue supplying power to the power port. In general, the MPS is monitored by detecting the presence of a minimum load connected to the power port. If the load connected to the power port is detected to be below certain minimum level, then it is assumed that the powered device has been unplugged or disconnected and the PSE discontinues supplying power to that power port.

The DC MPS is typically implemented by measuring the DC current draw on the power port by the load while the AC MPS is typically implemented by monitoring the AC impedance of the load connected to the power port. The AC MPS is present when the magnitude of the AC impedance of the port is less than a certain value with non-negative real and net capacitive reactive components. To implement AC MPS monitoring, the PSE is allowed to place a small, low-frequency AC test signal across the power port to measure the AC impedance.

SUMMARY OF THE INVENTION

According to one embodiment of the present invention, an AC maintain power signature detection circuit in a power sourcing equipment (PSE) for a Power over Ethernet system where the PSE provides a DC voltage to a power port of the PSE and the power port of the PSE includes first and second power terminals to be coupled to supply the DC voltage to a load includes a test signal generator circuit for generating an AC test signal at a first node where the AC test signal is a square wave at a first frequency and at a first set of voltage levels; a first diode coupled between a first power supply voltage and the first node; a sense resistor coupled between the first node and the first power terminal of the power port; a first resistor and a second resistor forming a first resistor divider for sensing a first voltage at the first node and providing a first scaled voltage at a common node between the first and second resistors where the first resistor divider has a first resistor ratio; a third resistor and a fourth resistor forming a second resistor divider for sensing a second voltage at the first power terminal of the power port and providing a second scaled voltage at a common node between the third and fourth resistors where the second resistor divider has a second resistor ratio different than the first resistor ratio and the second voltage and the second scaled voltage having a peak voltage being proportional to a load impedance of the load coupled to the power port and relative to the resistance of the sense resistor; and a comparator having a first input terminal coupled to receive the first scaled voltage and a second input terminal coupled to receive the second scaled voltage where the comparator generates an output signal having a first state when the first scaled voltage is greater than the second scaled voltage and a second state when the first scaled voltage is less than the second scaled voltage. In operation, the AC test signal is driven onto the first power terminal of the power port through the sense resistor. The first and second voltages across the sense resistor are sensed by the first and second resistor dividers. The comparator compares the first and second scaled voltages and generates the output signal indicative of the load impedance at the power port.

According to another aspect of the present invention, a method for detecting an AC maintain power signature on a power port of a power sourcing equipment for a Power Over Ethernet system where the power port is supplied with a DC voltage includes generating a square wave AC test signal at a first set of voltage levels at a first node; driving the AC test signal through a sense resistor to a first power terminal of the power port; measuring first and second voltages across the sense resistor using respective first and second resistor dividers to generate respective first and second scaled voltages where the first and second resistor dividers have respective first and second resistor ratios and the first resistor ratio is different from the second resistor ratio; comparing the first and second scaled voltages where the second voltage and the second scaled voltage have a peak voltage being proportional to a load impedance of the load coupled to the power port; and generating a comparison output signal having a first state when the first scaled voltage is greater than the second scaled voltage and a second state when the first scaled voltage is less than the second scaled voltage. The comparison output signal is indicative of the load impedance at the power port.

The present invention is better understood upon consideration of the detailed description below and the accompanying drawings.

DETAILED DESCRIPTION OF THE PREFERRED EMBODIMENTS

In accordance with the principles of the present invention, an AC maintain power signature detection circuit is incorporated in a power sourcing equipment (PSE) for a Power over Ethernet (PoE) system for detecting the presence or absence of an AC maintain power signature at a power port. The AC maintain power signature detection circuit drives a small, low-frequency AC test signal across a test resistor coupled to the power port and the current across the test resistor is measured to determine the AC impedance connected to the power port. The current across the test resistor is measured by two scaled voltages generated using unequal scale factors. The two scaled voltages are compared to generate a detect signal which toggles with a small impedance and does not toggle with a large impedance. Thus, the presence of AC MPS of the proper magnitude can be determined by monitoring the detect signal. Furthermore, the AC test signal is scaled to be proportional to the DC voltage on the power port so that the delay time of the toggles in the detect signal relative to the AC test signal are insensitive to variations in the value of the DC voltage.

Figure 1:
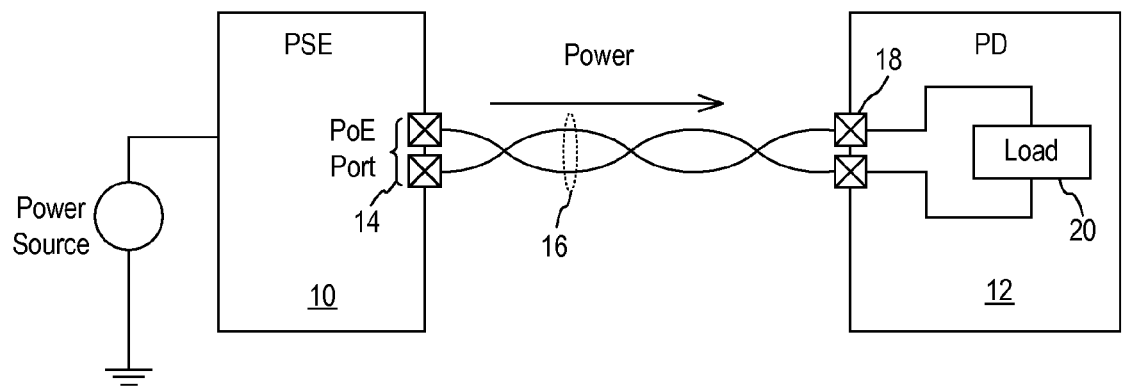
FIG. 1 is a block diagram of a PoE system in which the AC maintain power signature (MPS) detection circuit of the present invention is implemented according to one embodiment of the present invention.

FIG. 1 is a block diagram of a PoE system in which the AC maintain power signature (MPS) detection circuit of the present invention is implemented according to one embodiment of the present invention. Referring to FIG. 1, a PSE device 10 is coupled to an AC or DC power source for receiving AC or DC power. PSE 10 includes one or more power ports, such as power port 14, for providing power to one or more Powered Devices (PDs), such as PD 12. In the present description, a power port of a PSE refers to a port of the PSE that supplies at least power to a network device connected thereto. The power is provided on a pair of the twisted wire pairs, such as wire pair 16, of an Ethernet cable separate from the twisted wire pair carrying the data signals. Alternately, the power can be provided on the same twisted wire pair that also carry the data signals.

At the powered device 12, the received power at the power input port 18 is coupled to supply a load 20 representing the circuitry in PD 12 being supplied power from PSE 10. Load 20 can be a resistive load, a capacitive load or a combination of resistive and capacitive load.

Under the requirements of IEEE Standard 802.3-2005, section 33.2.10, PSE 10 must monitor power port 14 when the power port is powered up for the presence of either a DC, or AC, or both AC and DC Maintain Power Signatures (MPS). When the MPS is absent, the PSE must discontinue supplying power to the power port. In accordance with the present invention, an AC MPS detection circuit is incorporated in a power sourcing equipment to facilitate the detection of the AC maintain power signature at a power port supplying power to a powered device.

Figure 2:
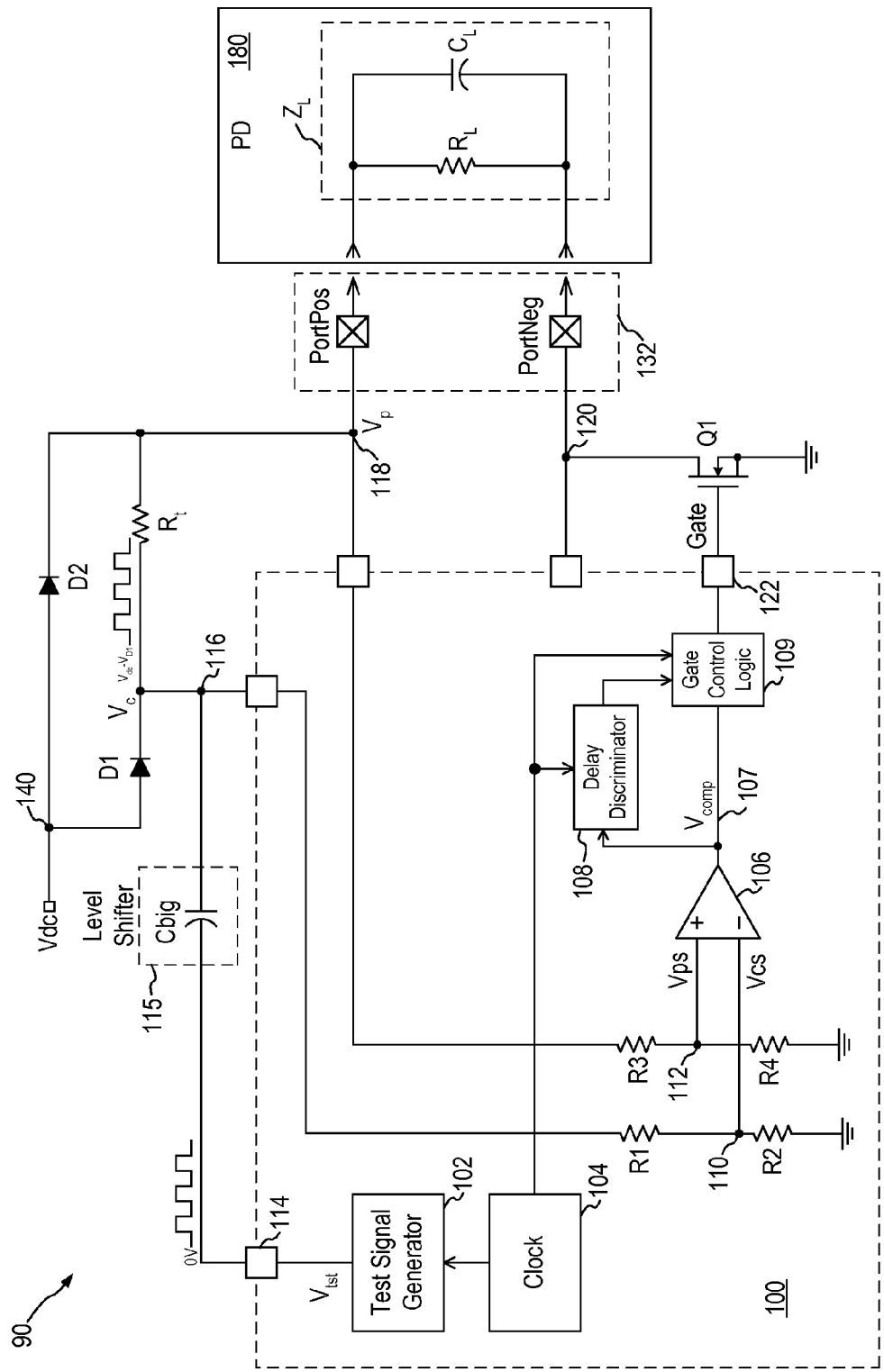
FIG. 2 is a circuit diagram of a power sourcing equipment incorporating an AC maintain power signature detection circuit according to one embodiment of the present invention.

FIG. 2 is a circuit diagram of a power sourcing equipment incorporating an AC maintain power signature detection circuit according to one embodiment of the present invention. Referring to FIG. 2, a power sourcing equipment (PSE) 90 includes a DC voltage source (not shown) for generating a DC voltage Vdc on a node 140. The DC voltage Vdc is coupled through a diode D2 to a node 118 which is coupled to the positive terminal (PortPos) of a power port 132 of PSE 90. In the present embodiment, the DC voltage source is a low impedance voltage source and generates a DC voltage Vdc of 44 to 57 volts. Diode D2 is configured to have its anode terminal coupled to DC voltage Vdc (node 140) and its cathode terminal coupled to the positive terminal PortPos of power port 132 so that diode D2 prevents currents from flowing back to the DC voltage node 140 from the power port.

Power port 132 of PSE 90 includes positive power terminal PortPos (node 118) and a negative power terminal PortNeg (node 120) to be coupled to a twisted wire pair of a communication cable for supplying power to a powered device, such as powered device 12. The voltage at the positive power terminal (node 118) of the power port is denoted $V_p$. The voltage at the negative power terminal (node 120) is switchably connected to the ground voltage through a switch Q1. In the present embodiment, switch Q1 is an NMOS transistor functioning as a switch to connect or disconnect the negative power terminal (node 120) to the ground voltage. When power is to be supplied on the twisted wire pair coupled to power port 132, switch Q1 is turned on to ground the negative power terminal (node 120). When power is to be discontinued, switch Q1 is turned off to disable current flow through the twisted wire pair, thereby terminating the power supply to power port 132. The control signal supplied to drive the gate terminal of transistor Q1 (node 122) therefore controls the power-on/power-off function of power port 132.

In the present illustration, power port 132 of PSE 90 is shown as being coupled to supply power to a powered device (PD) 180. The power supplied to PD 180 is coupled to drive a load having an impedance $Z_L$. Impedance $Z_L$ is represented as having a resistive component $R_L$ (load resistor) and a capacitive component $C_L$ (load capacitor). The impedance $Z_L$ of PD 180 can be purely resistive, purely capacitive or a combination of both.

PSE 90 includes an AC MPS detection circuit 100 for driving a low frequency AC test signal across power port 132 and for monitoring and detecting the AC MPS on the power port as a result of the AC test signal being imposed on power port 132. In the present embodiment, AC MPS detection circuit 100 includes a test signal generator 102 for generating a low frequency square wave as the AC test signal, denoted voltage signal $V_{tst}$, on a node 114. The low frequency square wave AC test signal has a low voltage level of 0V and a high voltage level of $V_{pk}$. The frequency of the square wave is set by a clock circuit 104. Clock circuit 104 generates a clock signal, such as a square wave, at a fixed frequency. In one embodiment, clock circuit 104 is a crystal oscillator. Furthermore, in one embodiment, the AC test signal $V_{tst}$ is a square wave having a frequency range from 5 Hz to 500 Hz.

The square wave AC test signal generated by test signal generator 102 on node 114 is coupled through a level shifting circuit 115. Level shifting circuit 115 is coupled between the output terminal (node 114) of test signal generator 102 and node 116 and operates to level shift the voltage signal $V_{tst}$. Thus, at node 116, the AC test signal, denoted as voltage signal $V_c$, is level shifted to a voltage level determined by the DC voltage Vdc and the voltage drop of diode D1, as will be described in more detail below. In the present embodiment, level shifting circuit 115 is implemented using a capacitor $C_{big}$. Capacitor $C_{big}$ has a large capacitance and therefore enables AC coupling of the AC test signal $V_{tst}$ through the capacitor without shift in the DC voltage level. Thus, at the other plate of capacitor Cbig (node 116), the AC test signal, denoted voltage signal $V_c$, is level shifted to the voltage level determined by the DC voltage Vdc and the voltage drop of diode D1. Level shifting circuit 115 can be implemented using other circuitry and the use of capacitor $C_{big}$ in the present embodiment is illustrative only. Furthermore, in alternate embodiments of the present invention, a test signal generator can be constructed to directly generate an AC test signal $V_c$ having the desired voltage levels. Therefore, no level shifting is necessary and the level shifter circuit can be omitted entirely. In that case, the test signal generator applies the AC test signal directly to node 116. The use of test signal generator 102 and level shifter 115 in the present embodiment is illustrative only.

The level-shifted square wave AC test signal $V_c$ is then forced through a current sense resistor $R_t$ into the positive power terminal PortPos (node 118) of power port 132. At node 118, the AC test signal is superimposed on the DC voltage Vdc to be applied to the positive power terminal PortPos of power port 132.

A diode D1 is coupled between the DC voltage Vdc and the current sense resistor to prevent current due to the AC test signal from flowing back into the DC voltage source. Diode D1 has an anode terminal coupled to the DC voltage Vdc (node 140) and a cathode terminal coupled to the level-shifted AC test signal $V_c$ (node 116). The AC test signal, being AC coupled through capacitor $C_{big}$, becomes level-shifted so that the AC test signal $V_c$ at node 116 has a low voltage level of $V_{dc}-V_{D1}$ and a high voltage level of $V_{dc}-V_{D1}+V_{pk}$, where $V_{D1}$ is the forward bias voltage drop across diode D1. Thus, during the positive cycle of the AC test signal, the AC test signal $V_c$ has a voltage level of $V_{dc}-V_{D1}+V_{pk}$ which is greater than DC voltage Vdc. Diode D1 is reversed biased and blocks current from flowing back into the DC power source providing the DC voltage. During the negative cycle of the AC test signal, the DC voltage source drives node 116 to the DC voltage Vdc minus the forward bias voltage drop of diode D1.

AC MPS detection circuit 100 further includes a resistor network to sense scaled versions of the voltages on both terminals of sense resistor $R_t$. More specifically, a first resistor divider of resistors R1 and R2 is connected between node 116 and ground to sense the voltage at voltage $V_c$ side of resistor $R_t$. A second resistor divider of resistors R3 and R4 is connected between node 118 and ground to sense the voltage at voltage $V_p$ side of resistor $R_t$. As a result, a voltage $V_{cs}$ being a scaled voltage of voltage Vs develops at a node 110 between resistors R1 and R2 and a voltage $V_{ps}$ being a scaled voltage of voltage $V_p$ develops at a node 112 between resistors R3 and R4. The scaled voltages $V_{cs}$ and $V_{ps}$ are then used to derive the components, resistive and/or capacitive, of the power port impedance relative to the sense resistor.

The scaled voltages $V_{cs}$ and $V_{ps}$ are coupled to a comparator 106 to be compared against each other. Comparator 106 generates an output signal $V_{comp}$ on an output node 107. Output signal $V_{comp}$ has signal levels indicative of whether voltage $V_{ps}$ is greater than or less than voltage $V_{cs}$. The output signal $V_{comp}$ is coupled to a gate control logic circuit 109. Gate control logic circuit 109 receives the clock signal from the clock circuit 104 and detects the toggling status of signal $V_{comp}$. Gate control logic circuit 109 generates a gate control signal on a node 122 for driving the gate terminal of NMOS transistor Q1, thereby controlling the power on-off function of power port 132. More specifically, when signal $V_{comp}$ is toggling, gate control logic circuit 109 generates the gate control signal having a logical high state to turn on switch Q1, thereby powering on power port 132. When signal $V_{comp}$ is not toggling, gate control logic circuit 109 generates the gate control signal having a logical low state to turn off switch Q1, thereby powering off power port 132.

In the present embodiment, the output signal $V_{comp}$ is also provided to a delay discriminator 108 which is coupled to receive the clock signal from clock circuit 104. Delay discriminator 108 measures the timing delay of the toggling signal $V_{comp}$ where the timing delay is indicative of the capacitive component of the load impedance. Delay discriminator 108 provides an output signal to gate control logic circuit 109. Gate control logic circuit 109 generates the gate control signal for switch Q1 based on the toggling state of the signal $V_{comp}$ and the timing delay measured by delay discriminator 108.

The operation of AC MPS detection circuit 100 for detecting of the AC maintain power signature on power port 132 realizes two important features. First, the resistor ratio of resistors R1 and R2 and the resistor ratio of resistors R3 and R4 are made unequal so that the two sensed voltages $V_{cs}$ and $V_{ps}$ are scaled using different scale factors. When the load impedance at power port 132 is small, the output signal $V_{comp}$ of comparator 106 will toggle at the AC test signal frequency. When the load impedance at power port 132 is large, the output signal $V_{comp}$ of comparator 106 will not toggle. The threshold impedance, defined as the power port impedance at which the comparator transitions from toggling to not toggling, is determined solely by the voltage scaling ratios (i.e. resistor ratios of resistors R1/R2 and R3/R4) and the resistance value of the current sense resistor $R_t$. Thus, the presence of an AC MPS of the proper magnitude at the power port can be determined by simply monitoring the output signal $V_{comp}$ generated by comparator 106.

Secondly, the amplitude of the AC test signal is purposefully scaled to be proportional to the DC voltage on the power port. Accordingly, when the power port load has a capacitive component, the time at which the output signal $V_{comp}$ of comparator 106 toggles relative to the rising edge of the AC test signal is determined solely by the sense voltage scaling ratios (i.e. resistor ratios of resistors R1/R2 and R3/R4), the AC test signal scaling ratio (i.e. a resistor ratio for scaling the DC voltage Vdc to generate the AC test signal), the resistance value of the sense resistor $R_t$, and the value of the port load capacitance. That is, due to the capacitive component of the power port, there is a time delay from the rising edge of the AC test signal to the point where voltage $V_{ps}$ equals voltage $V_{cs}$. Thus, the presence of an AC MPS indicative of the capacitive component of the load impedance can be determined by discriminating against this time delay through the use of a digital counter or other delay discriminator.

The operation of AC MPS detection circuit 100 will now be described in detail with reference to FIGS. 3A, 3B, 3C and 4. By using AC MPS detection circuit 100, the load impedance $Z_L$ of the powered device PD 180 is determined by sensing the current flowing through sense resistor $R_t$ and the voltage impressed across the load at the positive power terminal of power port 132. The current flowing through sense resistor $R_t$ is determined from the voltages $V_c$ and $V_p$, or a scaled version thereof, and the resistance value of resistor $R_t$.

The square wave level-shifted AC test signal is driven out onto the positive power terminal through sense resistor $R_t$. Resistor $R_t$ and the load resistor $R_L$ becomes a voltage divider. First, it is assumed that the load driven by power port 132 is purely resistive, the value of the high voltage level (the peak voltage) of the square wave of signal $V_p$ at node 118 will depend upon the value of load resistance $R_L$. More specifically, for a purely resistive load, the low voltage level of signal $V_p$ (denoted "$V_{p\text{-}low}$") at node 118 will be:

$$V_{p\text{-}low} = V_{dc} - V_{D2} \qquad \text{Eq. (1)}$$

And the high voltage level of signal $V_p$ (denoted "$V_{p\text{-}high}$") will be:

$$V_{p\text{-}high} = \frac{R_L}{R_L + R_t}(V_{dc} - V_{D1} + V_{pk}). \qquad \text{Eq. (2)}$$

In the case where the load resistance $R_L$ is sufficiently low, such as when resistance $R_L$ is less than a minimum threshold value $R_{L\text{-}clamp}$, no square wave will be injected at node 118 and signal $V_p$ will be DC only since the square wave drive current is limited by sense resistor $R_t$ and cannot overcome the DC current flowing through diode D2. So, equation (2) above is true as long as:

$$R_L > R_{L\text{-}clamp} = \frac{V_{dc} - V_{D2}}{V_{pk}} R_t \qquad \text{Eq. (3)}$$

Figure 3A:
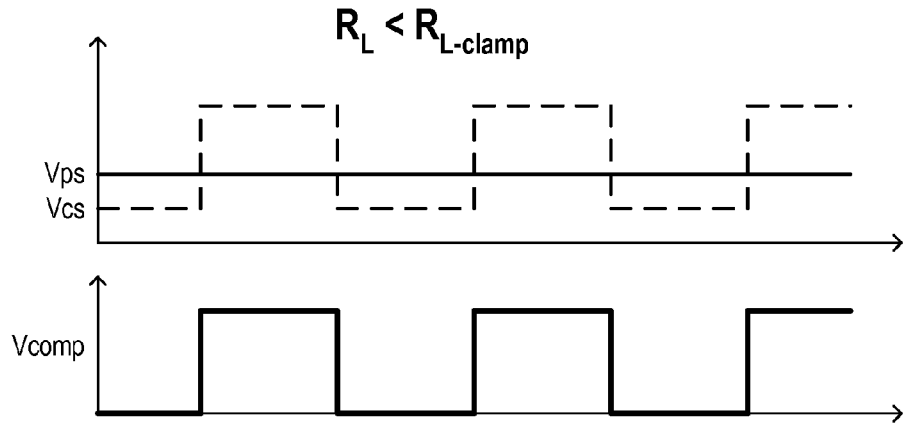
FIG. 3A illustrates the signal waveforms for the scaled voltage signals $V_{cs}$ and $V_{ps}$ as well the comparator output signal $V_{comp}$ for the case where the load resistor $R_L$ is less than the minimum threshold value $R_{L\text{-}clamp}$.

FIG. 3A illustrates the signal waveforms for the scaled voltage signals $V_{cs}$ and $V_{ps}$ as well the comparator output signal $V_{comp}$ for the case where the load resistor $R_L$ is less than the minimum threshold value $R_{L\text{-}clamp}$. A low resistance value $R_L$ indicates the presence of a large load at the power port. As shown in FIG. 3A, voltage signal $V_{cs}$, which is the scaled signal of voltage signal $V_c$, toggles according to the AC test signal. However, the voltage signal $V_{ps}$, which is the scaled signal of voltage signal $V_p$, does not toggle at all and is a DC signal only.

When the load resistance $R_L$ is low indicating a heavy load at the powered device, no AC test signal is injected into the power port because the AC test signal cannot overcome the large load current provided by the DC current source and flowing through diode D2. The lack of the AC test signal does not present a problem when large load current is drawn from the DC voltage source. The large load current itself is an indication that there must be a load present at the power port demanding power and therefore the PSE will not shut off power to the power port. Equation (3) above indicates the point at which the load resistance has increased sufficiently and the load current drawn is reduced sufficiently so that the square wave AC test signal can be injected into power port 132.

Furthermore, even when no AC test signal is pushed onto the power port because the load is so large and the load resistance is so low and the voltage signal $V_p$ and the sensed voltage $V_{ps}$ is DC only, the comparator output signal $V_{comp}$ will toggle because the voltage $V_{cs}$ still follows the AC test signal, as shown in FIG. 3A. Therefore, when the toggling state of signal $V_{comp}$ is used as an indication of sufficient load at the power port, PSE 90 will continue to supply power to the power port even when no AC test signal is actually driven onto the power port.

Figure 3B:
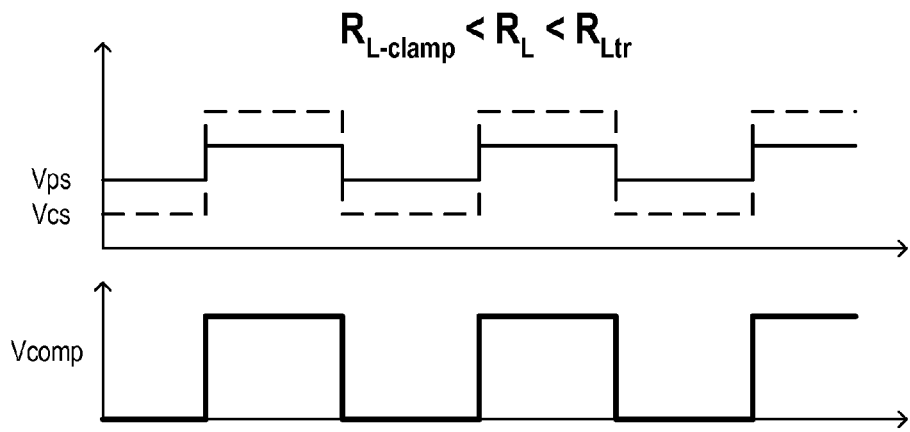
FIG. 3B illustrates the signal waveforms for the scaled voltage signals $V_{cs}$ and $V_{ps}$ as well the comparator output signal $V_{comp}$ for the case where the load resistor $R_L$ is greater than the minimum threshold value $R_{L\text{-}clamp}$ but smaller than a maximum threshold value $R_{Ltr}$.
Figure 3C:
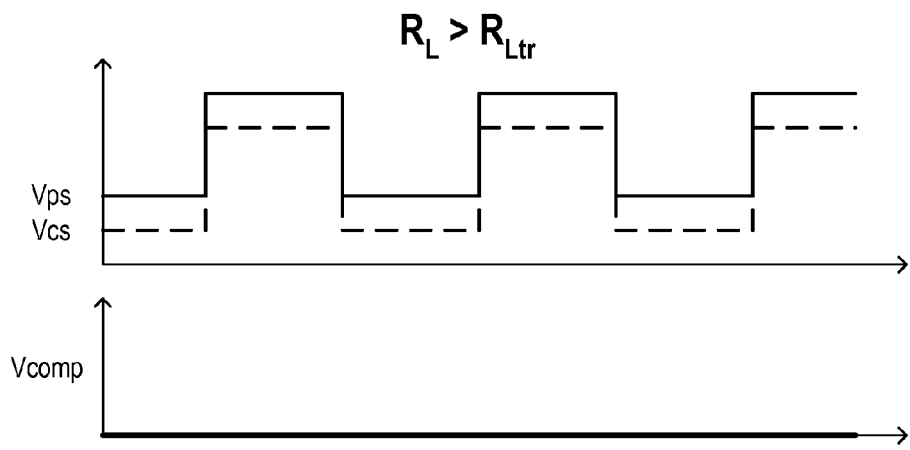
FIG. 3C illustrates the signal waveforms for the scaled voltage signals $V_{cs}$ and $V_{ps}$ as well the comparator output signal $V_{comp}$ for the case where the load resistor $R_L$ is greater than the maximum threshold value $R_{Ltr}$.

FIG. 3B illustrates the signal waveforms for the scaled voltage signals $V_{cs}$ and $V_{ps}$ as well the comparator output signal $V_{comp}$ for the case where the load resistor $R_L$ is greater than the minimum threshold value $R_{L\text{-}clamp}$ but smaller than a maximum threshold value $R_{Ltr}$. FIG. 3C illustrates the signal waveforms for the scaled voltage signals $V_{cs}$ and $V_{ps}$ as well the comparator output signal $V_{comp}$ for the case where the load resistor $R_L$ is greater than the maximum threshold value $R_{Ltr}$. As shown in FIGS. 3B and 3C, voltage signal $V_{cs}$ and voltage signal $V_{ps}$ both toggle according to the AC test signal. The high voltage level of voltage signal $V_{ps}$ is a function of the voltage divider of the sense resistor $R_t$ and load resistor $R_L$. Therefore, the peak-to-peak voltage of voltage signal $V_{ps}$ varies as a function of the load impedance $R_L$ and the high voltage level of voltage signal $V_{ps}$ is either less than or greater than the high voltage level of voltage signal $V_{cs}$ depending on the load impedance $R_L$.

At the AC MPS detection circuit 100, the scaled voltages are measured as follows. Let:

$$K_2 = \frac{R_2}{R_1 + R_2} \text{ and } K_4 = \frac{R_4}{R_3 + R_4}.$$

Then, the low and high voltage levels of voltage signals $V_{cs}$ and $V_{ps}$ are given as:

$$V_{cs\text{-}low} = K_2(V_{dc} - V_{D1}) \qquad \text{Eq. (4)}$$

$$V_{cs\text{-}high} = K_2(V_{dc} - V_{D1} + V_{pk}) \qquad \text{Eq. (5)}$$

$$V_{ps\text{-}low} = K_4(V_{dc} - V_{D2}) \qquad \text{Eq. (6)}$$

$$V_{ps\text{-}high} = K_4 \frac{R_L}{R_L + R_t}(V_{dc} - V_{D1} + V_{pk}) \qquad \text{Eq. (7)}$$

A salient feature of the AC MPS detection circuit 100 of the present invention is that the resistor ratios of resistors R1/R2 and R3/R4 are selected to be unequal. If $K_2$ is less than $K_4$, then during the low part of the square wave AC test signal, voltage $V_{cs\text{-}low}$ will always be less than voltage $V_{ps\text{-}low}$ and the output signal $V_{comp}$ of the comparator 106 will be low. During the high part of the square wave AC test signal, voltage $V_{ps}$ may be greater than or less than voltage $V_{cs}$, depending upon the value of the load resistance $R_L$.

Thus, during the high part of the square wave AC test signal, the output signal $V_{comp}$ of the comparator may either stay low (FIG. 3C) or go high (FIG. 3B). When the comparator output signal stays low during the high part of the square wave, the resulting signal $V_{comp}$ will therefore not toggle, as shown in FIG. 3C. When the comparator output signal goes high during the high part of the square wave, then signal $V_{comp}$ toggles with the AC test signal, as shown in FIG. 3B. There is a threshold value of load resistance $R_L$ where output signal $V_{comp}$ transitions from toggling to non-toggling. Thus, the toggling status of output signal $V_{comp}$ can be monitored to determine if the load resistance $R_L$ has increased beyond a desired level, indicating that the load is either disconnected or no longer desires power.

The comparator trip point at which output signal $V_{comp}$ transitions from toggling to non-toggling is the point where voltage $V_{cs\text{-}high}$ equals $V_{ps\text{-}high}$. Let resistance $R_{Ltr}$ be the value of load resistance $R_L$ where $V_{cs\text{-}high}$ equals $V_{ps\text{-}high}$, i.e.

$$K_4 \frac{R_{Ltr}}{R_{Ltr} + R_t}(V_{dc} - V_{D1} + V_{pk}) = K_2(V_{dc} - V_{D1} + V_{pk}). \qquad \text{Eq. (8)}$$

Assuming $V_{D2}=V_{D1}$, solving Equation (8) for $R_{Ltr}$ gives:

$$R_{Ltr} = \left(\frac{K_2}{K_4 - K_2}\right)R_t. \qquad \text{Eq. (9)}$$

By examining Equation (9), the amount of load resistance at which comparator 106 switches from toggling to non-toggling depends only upon the resistor ratios $K_2$ and $K_4$ and the resistance value of sense resistor $R_t$. Thus, in AC MPS detection circuit 100, the toggling state of signal $V_{comp}$ is used as an indication of sufficient load at the power port. When signal $V_{comp}$ toggles, there is sufficient load at the power port and power should be continually provided. When signal $V_{comp}$ does not toggle, there is insufficient load at the power port and power should be discontinued at the power port. The trip point for establishing sufficient load impedance is determined solely by the resistor ratios $K_2$ and $K_4$ and the resistance value of sense resistor $R_t$, as given in Equation (9) above. Thus, the proper operation of AC MPS detection circuit 100 is established by selecting the appropriate resistance values for resistors R1, R2, R3, R4 and $R_t$.

Figure 4:
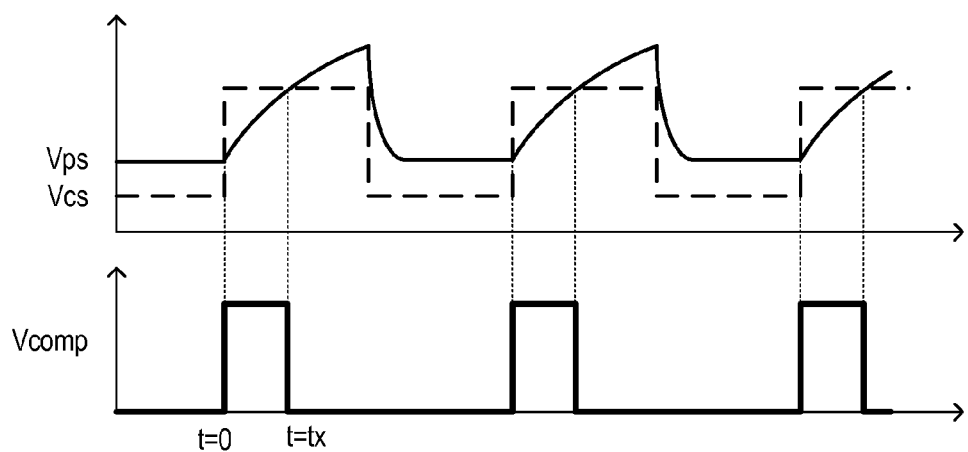
FIG. 4 illustrates the signal waveforms for the scaled voltage signals $V_{cs}$ and $V_{ps}$ as well the comparator output signal $V_{comp}$ for the case where the load impedance is purely capacitive.

The operation of AC MPS detection circuit 100 with a purely resistive load at power port 132 is described above. Attention is now turned to the case where the load impedance of PD 180 includes a capacitive component. FIG. 4 illustrates the signal waveforms for the scaled voltage signals $V_{cs}$ and $V_{ps}$ as well the comparator output signal $V_{comp}$ for the case where the load impedance is purely capacitive. In the case where the load is purely capacitive and $C_L \ll C_{big}$, the rising edge of the voltage at $V_p$ will be:

$$V_p(t) = (V_{dc} - V_{D2}) + V_{pk}\left(1 - e^{\frac{-t}{R_t C_L}}\right). \qquad \text{Eq. (10)}$$

The voltage $V_{ps}$ at node 112 will be voltage $V_p(t)$ in Eq. (10) scaled by the resistor ratio $K_4$. As a result of the capacitive load, there will be a time delay from the rising edge of the AC test signal to the point where voltage $V_{ps}$ equals voltage $V_{cs}$, denoted by a time $t_x$ in FIG. 4 where the delay time $t_x$ is given by:

$$t_x = -R_t C_L \ln\left[\left(1 - \frac{K_2}{K_4}\right)\frac{V_{dc} - V_{D1} + V_{pk}}{V_{pk}}\right] \qquad \text{Eq. (11)}$$

From examining Eq. (11), the delay time $t_x$ is dependent upon the voltage value of DC voltage $V_{dc}$ and the voltage value of the peak voltage $V_{pk}$ of the AC test signal. According to one embodiment of the present invention, the peak voltage $V_{pk}$ is scaled so that voltage $V_{pk}$ is proportional to voltage Vdc. In this manner, the AC MPS detection circuit is made power supply independent. The scaling of the peak voltage is carried out as follows. First, assume that $V_{D1} \ll V_{dc}$, a voltage $V_{pk}$ is selected so that voltage $V_{pk}$ is scaled from voltage $V_{dc}$ by a factor of $K_{sq}$. Then, the delay time $t_x$ can be expressed as:

$$t_x = -R_t C_L \ln\left[\left(1 - \frac{K_2}{K_4}\right)\left(1 + \frac{1}{K_{sq}}\right)\right] \qquad \text{Eq. (12)}$$

In accordance with one embodiment of the present invention, a test signal generator is designed to generate a square wave signal that is scaled to voltage $V_{dc}$ where the scale factor $K_{sq}$ is determined by a ratio of resistors. Thus, the time at which the comparator 106 trips will then depend only upon resistor ratios, the fixed value of resistor $R_t$ and the load capacitance $C_L$. The delay time $t_x$ is then used to discriminate when the load capacitance has exceeded some predetermined threshold value. In AC MPS detection circuit 100, delay discriminator 108 measures the delay time $t_x$ against a predetermined threshold value. Delay discriminator 108 receives the clock frequency of the AC test signal from clock circuit 104. A delay time $t_x$ that is shorter than the predetermined threshold indicates a small load capacitance and power supply to the power port is to be discontinued. A delay time $t_x$ that is greater than the predetermined threshold indicates a large load capacitance and power supply to the power port should be continued.

It should be noted that the value of the argument of the natural log function in Equation (12) must be less than 1, but this condition can be achieved by properly choosing the values of the resistor ratios that determine $K_2$, $K_4$, and $K_{sq}$. Furthermore, in the present embodiment, delay discriminator 108 is included to measure the MPS due to capacitive loading at the power port. In some embodiments, delay discriminator 108 may be omitted when the load impedance at the power port is mainly resistive. In that case, the comparator output signal $V_{comp}$ is coupled directly to the gate control logic circuit 109 for controlling switch Q1.

In the above description, it is assumed that the load capacitance $C_L$ is much smaller than the capacitance of capacitor $C_{big}$ so that the AC test signal can be driven onto the power port.

Figure 5:
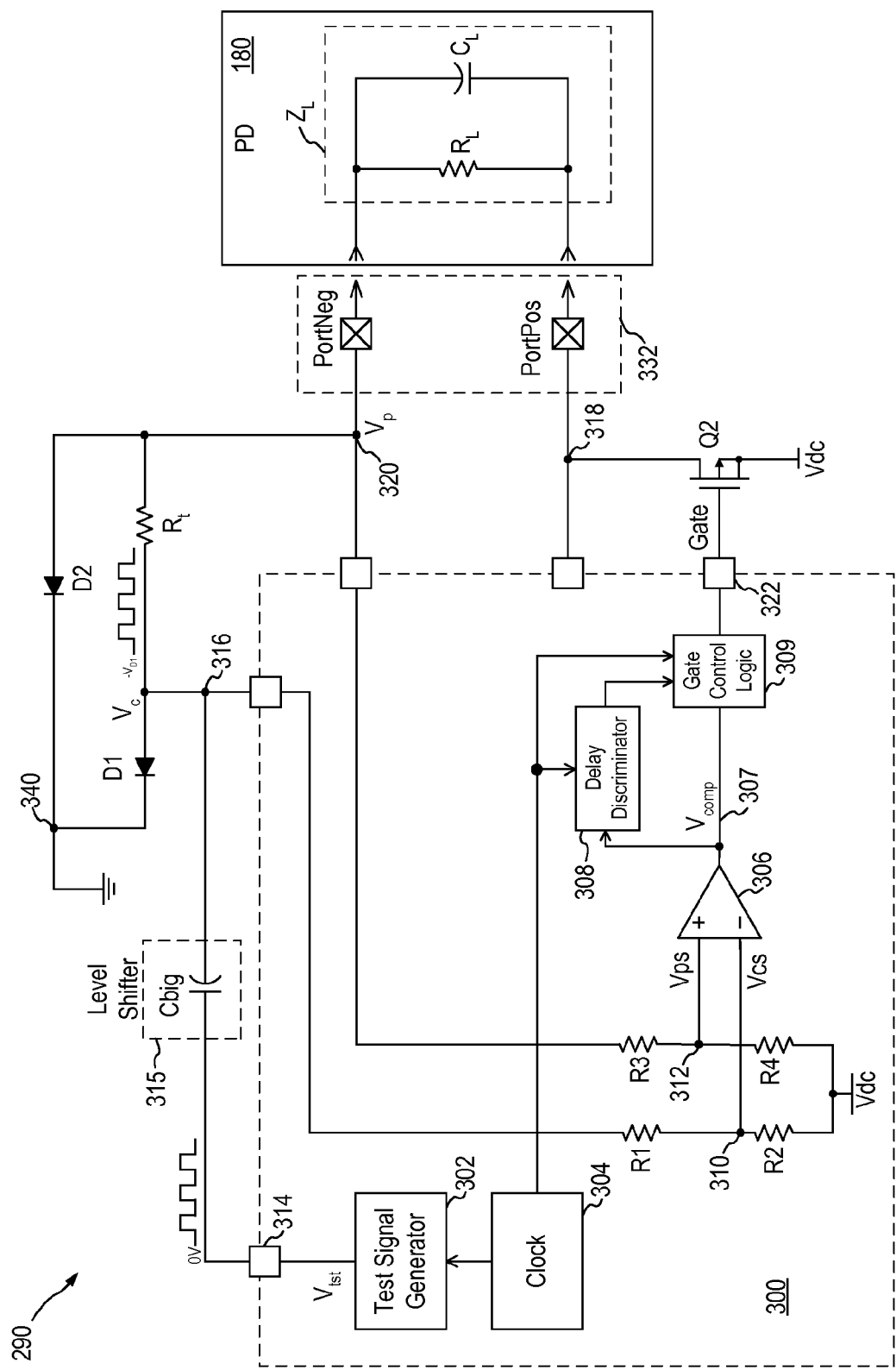
FIG. 5 is a circuit diagram of a power sourcing equipment incorporating an AC maintain power signature detection circuit according to an alternate embodiment of the present invention.

According to another aspect of the present invention, the AC test signal can be injected onto the negative power terminal of the power port instead of the positive power terminal. FIG. 5 is a circuit diagram of a power sourcing equipment incorporating an AC maintain power signature detection circuit according to an alternate embodiment of the present invention. Referring to FIG. 5, an AC maintain power signature (MPS) detection circuit 300 is incorporated in a PSE 290. To inject the AC test signal onto the negative power terminal, the construction of AC MPS detection circuit 300 is implemented as a mirror image of the AC MPS detection circuit 100 of FIG. 2. More specifically, a switch Q2 is coupled to the positive power terminal (node 318) to switchably connect the positive power terminal to the DC voltage Vdc. In one embodiment, switch Q2 is a PMOS transistor. Sense resistor $R_t$ is coupled between a node 316 receiving the level shifted AC test signal and the negative power terminal (node 320. The resistor network of R1, R2, R3, and R4 is coupled to measure the voltage across the sense resistor $R_t$ in the same manner as AC MPS detection circuit 100 except with opposite voltage polarities. Diodes D1 and D2 are also reversed where the cathode terminals are coupled to the ground voltage (node 340).

The above detailed descriptions are provided to illustrate specific embodiments of the present invention and are not intended to be limiting. Numerous modifications and variations within the scope of the present invention are possible. For example, in the above description, MOS transistors Q1 and Q2 are used as the switches to switchably connect the power terminal of the power port to the power supply voltage (Vdc or ground). In other embodiments, other transistors or transistor configurations can be used to implement switches Q1 and Q2. The present invention is defined by the appended claims.

I claim:

1. An AC maintain power signature detection circuit in a power sourcing equipment (PSE) for a Power over Ethernet system, the PSE providing a DC voltage to a power port of the PSE, the power port of the PSE comprising first and second power terminals to be coupled to supply the DC voltage to a load, the AC maintain power signature detection circuit comprising:

a test signal generator circuit for generating an AC test signal at a first node, the AC test signal being a square wave at a first frequency and at a first set of voltage levels;

a first diode coupled between a first power supply voltage and the first node;

a sense resistor coupled between the first node and the first power terminal of the power port;

a first resistor and a second resistor forming a first resistor divider for sensing a first voltage at the first node and providing a first scaled voltage at a common node between the first and second resistors, the first resistor divider having a first resistor ratio;

a third resistor and a fourth resistor forming a second resistor divider for sensing a second voltage at the first power terminal of the power port and providing a second scaled voltage at a common node between the third and fourth resistors, the second resistor divider having a second resistor ratio different than the first resistor ratio, the second voltage and the second scaled voltage having a peak voltage being proportional to a load impedance of the load coupled to the power port and relative to the resistance of the sense resistor; and a comparator having a first input terminal coupled to receive the first scaled voltage and a second input terminal coupled to receive the second scaled voltage, the comparator generating an output signal having a first state when the first scaled voltage is greater than the second scaled voltage and a second state when the first scaled voltage is less than the second scaled voltage, wherein the AC test signal is driven onto the first power terminal of the power port through the sense resistor, the first and second voltages across the sense resistor are sensed by the first and second resistor dividers, the comparator compares the first and second scaled voltages and generates the output signal indicative of the load impedance at the power port.

2. The AC maintain power signature detection circuit of claim 1, wherein the first power terminal comprises a positive power terminal and the second power terminal comprises a negative power terminal, the DC voltage being coupled to the positive power terminal through a second diode, the second diode having an anode coupled to the DC voltage and a cathode coupled to the positive power terminal; and wherein the first diode has an anode coupled to the first power supply voltage being the DC voltage and a cathode coupled to the first node.

3. The AC maintain power signature detection circuit of claim 2, wherein the first resistor and the second resistor are connected in series between the first node and a ground voltage; and wherein the third resistor and the fourth resistor are connected in series between the first power terminal of the power port and the ground voltage.

4. The AC maintain power signature detection circuit of claim 1, wherein the first power terminal comprises a negative power terminal and the second power terminal comprises a positive power terminal, the ground voltage being coupled to the negative power terminal through a second diode, the second diode having an anode coupled to the negative power terminal and a cathode coupled to the ground voltage; and wherein the first diode has an anode coupled to the first node and a cathode coupled to the first power supply voltage being the ground voltage.

5. The AC maintain power signature detection circuit of claim 4, wherein the first resistor and the second resistor are connected in series between the first node and the DC voltage; and wherein the third resistor and the fourth resistor are connected in series between the first power terminal of the power port and the DC voltage.

6. The AC maintain power signature detection circuit of claim 1, wherein the test signal generator circuit generates the AC test signal at a second set of voltage levels different from the first set of voltage levels, and the detection circuit further comprises a level shifting circuit receiving the AC test signal from the test signal generator circuit and generating a level-shifted AC test signal at the first node, the level-shifted AC test signal being at the first set of voltage levels.

7. The AC maintain power signature detection circuit of claim 6, wherein the level shifting circuit comprises a first capacitor having a first plate receiving the AC test signal from the test signal generator circuit and a second plate coupled to the first node, the first capacitor AC coupling the AC test signal to the first node.

8. The AC maintain power signature detection circuit of claim 1, further comprising a clock circuit for setting the first frequency of the square wave generated by the test signal generator.

9. The AC maintain power signature detection circuit of claim 1, wherein the output signal of the comparator toggles between the first state and the second state when the load impedance is smaller than a load impedance threshold level and the output signal of the comparator does not toggle when the load impedance is greater than the load impedance threshold level.

10. The AC maintain power signature detection circuit of claim 9, wherein the PSE further comprises a control logic circuit coupled to receive the output signal of the comparator and to generate a control signal indicative of a toggling state of the output signal of the comparator; and a switch coupled between the second power terminal of the power port and a second power supply voltage and having a control terminal coupled to receive the control signal from the control logic circuit, where in response to the control signal, the switch is closed to supply power to the power port and is open to discontinue supplying power to the power port, the second power supply voltage being one of the DC voltage and the ground voltage.

11. The AC maintain power signature detection circuit of claim 10, wherein the switch comprises a MOS transistor having a drain terminal coupled to the second power terminal, a source terminal coupled to the second power supply voltage and the gate terminal being the control terminal.

12. The AC maintain power signature detection circuit of claim 10, further comprising a delay discriminator coupled to receive the output signal of the comparator and measuring a delay time of the toggles in the output signal of the comparator relative to the AC test signal, the delay discriminator generating a second control signal indicative of the load impedance at the power port, the second control signal being coupled to the control logic circuit.

13. The AC maintain power signature detection circuit of claim 12, wherein the AC test signal is scaled from the DC voltage using a third resistor ratio.

14. The AC maintain power signature detection circuit of claim 13, wherein the delay time is a function of the first, second and third resistor ratios, the resistance value of the sense resistor, and the capacitance of the load impedance of the load.

15. The AC maintain power signature detection circuit of claim 9, wherein the comparator has a comparison trip point when the first scaled voltage is equal to the second scaled voltage, the comparison trip point is indicative of the load impedance threshold level and is a function of the first and second resistor ratios and the resistance value of the sense resistor.

16. The AC maintain power signature detection circuit of claim 15, wherein the output signal of the comparator toggles at the first frequency of the AC test signal when the load impedance of the load is less than the load impedance threshold level associated with the comparison trip point, and the output signal does not toggle when the load impedance of the load is greater than the load impedance threshold level.

17. The AC maintain power signature detection circuit of claim 15, wherein the first resistor ratio, denoted $K_2$, and the second resistor ratio, denoted $K_4$, are given as:

$$K_2 = \frac{R_2}{R_1 + R_2} \text{ and } K_4 = \frac{R_4}{R_3 + R_4},$$

where $R_1$, $R_2$, $R_3$ and $R_4$ are resistance values of the first, second, third and fourth resistors.

18. The AC maintain power signature detection circuit of claim 17, wherein the first resistor ratio $K_2$ is less than the second resistor ratio $K_4$.

19. The AC maintain power signature detection circuit of claim 17, wherein the load impedance threshold level is given as:

$$R_{Ltr} = \left(\frac{K_2}{K_4 - K_2}\right) R_t.$$

20. A method for detecting an AC maintain power signature on a power port of a power sourcing equipment for a Power Over Ethernet system, the power port being supplied with a DC voltage, the method comprising:
generating a square wave AC test signal at a first set of voltage levels at a first node;
driving the AC test signal through a sense resistor to a first power terminal of the power port;
measuring first and second voltages across the sense resistor using respective first and second resistor dividers to generate respective first and second scaled voltages, the first and second resistor dividers having respective first and second resistor ratios, the first resistor ratio being different from the second resistor ratio;
comparing the first and second scaled voltages, the second voltage and the second scaled voltage having a peak voltage being proportional to a load impedance of a load coupled to the power port; and
generating a comparison output signal having a first state when the first scaled voltage is greater than the second scaled voltage and a second state when the first scaled voltage is less than the second scaled voltage, the comparison output signal being indicative of the load impedance at the power port.

21. The method of claim 20, wherein generating a square wave AC test signal at a first set of voltage levels at a first node comprises:
generating a square wave AC test signal at a second set of voltage levels at the first node; and
level shifting the square wave AC test signal to the first set of voltage levels and providing the level-shifted AC test signal to the first node.

22. The method of claim 20, wherein generating the comparison output signal comprises:
generating the comparison output signal that toggles between the first state and the second state when the load impedance is smaller than a load impedance threshold level; and
generating the comparison output signal that does not toggle when the load impedance is greater than the load impedance threshold level.

23. The method of claim 22, wherein the PSE comprises a switch coupled to the power port, in response to a control signal, being closed to supply power to the power port or being open to discontinue supplying power to the power port, the method further comprising:
detecting the toggling state of the comparison output signal;
generating the control signal being indicative of the toggling state of the comparison output signal; and
providing the control signal to the switch.

24. The method of claim 22, wherein comparing the first and second scaled voltages comprises comparing the first and second scaled voltages using a comparison trip point when the first scaled voltage is equal to the second scaled voltage, the comparison trip point being indicative of a load impedance threshold level and is a function of the first and second resistor ratios and the resistance value of the sense resistor.

25. The method of claim 24, wherein generating a comparison output signal comprises:
generating a comparison output signal that toggles at the first frequency of the AC test signal when the load impedance of the load is less than the load impedance threshold level associated with the comparison trip point; and
generating a comparison output signal that does not toggle when the load impedance of the load is greater than the load impedance threshold level.

26. The method of claim 23, further comprising:
measuring a delay time of the toggles in the comparison output signal relative to the AC test signal;
generating a second control signal indicative of the load impedance at the power port; and
generating the control signal being indicative of the toggling state of the comparison output signal and the second control signal.

27. The method of claim 20, wherein driving the AC test signal through a sense resistor to a first power terminal of the power port comprises driving the AC test signal through a sense resistor to a positive power terminal of the power port.

28. The method of claim 20, wherein driving the AC test signal through a sense resistor to a first power terminal of the power port comprises driving the AC test signal through a sense resistor to a negative power terminal of the power port.

* * * * *